350-357
5/15/79    OR    4,154,512

United States Patent [19]
Rode

[11] 4,154,512
[45] May 15, 1979

[54] ELECTROCHROMIC INDICATOR

[75] Inventor: Oyars A. Rode, Riga, U.S.S.R.

[73] Assignee: Latviisky Gosudarstvenny Universitet Imeni P. Stuchki, Riga, U.S.S.R.

[21] Appl. No.: 816,264

[22] Filed: Jul. 18, 1977

[30] Foreign Application Priority Data

Jul. 21, 1976 [SU] U.S.S.R. ............................ 2389744

[51] Int. Cl.² ............... G04B 19/34; G04B 19/30; G04C 17/00
[52] U.S. Cl. .................... 350/357; 58/23 R; 58/50 R; 307/270; 325/455; 340/785
[58] Field of Search ............ 307/270, 223 R; 350/357; 58/23 R, 50 R; 340/324 R, 324 EC, 336, 378 R; 325/455

[56] References Cited

U.S. PATENT DOCUMENTS

| 3,807,832 | 4/1974 | Castellion | 350/357 |
| 3,961,842 | 6/1976 | Jasinski | 350/357 |
| 3,968,639 | 7/1976 | Berets et al. | 350/357 X |
| 4,007,583 | 2/1977 | Johnson | 58/50 R |
| 4,060,974 | 12/1977 | Natori et al. | 58/50 R X |
| 4,060,975 | 12/1977 | Yamaguchi | 58/50 R |

*Primary Examiner*—Larry N. Anagnos
*Attorney, Agent, or Firm*—Lackenbach, Lilling & Siegel

[57] ABSTRACT

The proposed electrochromic indicator can be used in clock dials and band selector indicators of radio receivers and it comprises electrochromic cells placed in series to form a closed circuit. Each point of connection of the leads of said electrochromic cells is coupled via a respective switching means to the terminals of a d.c. voltage source. Each switching means comprises two transistors of different conductivity, whose emitters are connected to a respective point of connection of the leads of the electrochromic cells. The collector of one of the transistors is connected to the negative terminal of the d.c. voltage source, and the collector of the other transistor is connected to the positive terminal of that source. The bases of the transistors are connected to a respective control signal bus and are connected via a resistor to one of the terminals of the d.c. voltage source.

4 Claims, 3 Drawing Figures

ELECTROCHROMIC INDICATOR

FIELD OF THE INVENTION

The present invention relates to optoelectronics and, more particularly, to an electrochromic indicator to be used in discrete scanning display systems, for instance, in clocks with a colored dot moving in rapid steps along the periphery of the dial, or in panel display systems showing colored dots interchanging in rapid succession.

DESCRIPTION OF THE PRIOR ART

There is known an electrochromic indicator, wherein the terminals of a d.c. voltage source are electrically connected to electrochromic cells via switching means which successively switch the terminals of the d.c. voltage source, under the action of control signals, to the anode and cathode leads of the electrochromic cells; depending on the polarity of voltage applied to an electrochromic cell, the cell is either bleached or exhibits coloration.

An electrochromic cell is an optical element whose properties are changed depending on the polarity and magnitude of the voltage applied between its cathode and anode leads; voltage of one polarity makes such a cell exhibit colorations and voltage of the opposite polarity bleaches it.

In the known electrochromic indicator, the cathode leads of the electrochromic cells are interconnected and connected via a switching means to the negative terminal of the d.c. voltage source and via another switching means to the positive terminal of said d.c. voltage source.

In addition, the anode of each electrochromic cell is coupled via two switching means of its own to both terminals of the d.c. voltage source.

The sequence, in which control signals are applied to all the above-mentioned switching means, is preset by an external control circuit.

Whenever an electrochromic cell of the known indicator is to exhibit coloration, two control signals are applied to the respective switching means incorporated in the anode and cathode circuits of this cell; as a result, the positive terminal of the d.c. voltage source is connected to the anode of the electrochromic cell, and the negative terminal of the d.c. voltage source is connected to the cell's cathode.

Whenever the electrochromic cell is to be bleached, two more control signals are applied to the respective switching means, whereby voltage of the opposite polarity is applied to the anode and cathode of the electrochromic cell. It is impossible to color one electrochromic cell and bleach another at the same time because all the cathode leads are coupled to the terminals of the d.c. voltage source via common switching means.

Another disadvantage of the known electrochromic indicator is the complicated manner of controlling the coloring and bleaching of an electrochromic cell, for which purpose the control circuit has to send four control signals.

SUMMARY OF THE INVENTION

It is an object of the present invention to provide an electrochromic indicator with a faster response.

It is another object of the invention to provide an electrochromic indicator with simple control of the bleaching and coloring of the electrochromic cells.

The foregoing and other objects of the present invention are attained by providing an electrochromic indicator, wherein the terminals of a d.c. voltage source are electrically connected to electrochromic cells via switching means which sequentially connect, under the action of control signals, the terminals of the d.c. voltage source to the anode and cathode leads of the electrochromic cells which are colored or bleached, depending on the polarity of the voltage. In accordance with the invention, the electrochromic cells are placed in series to form a closed circuit, the anode lead of one electrochromic cell being connected to the cathode lead of the next electrochromic cell, the point of connection of these leads being coupled to both terminals of the d.c. voltage source via a respective switching means. Each of the switching means is constructed as an electronic switch built of two transistors with different conductivity, the emitters of said transistors being connected to the respective point of connection of the leads of the electrochromic cells, the collector of one of the transistors being connected to the negative terminal of the d.c. voltage source, the collector of the other transistor being connected to the positive terminal of the d.c. voltage source, and the bases of the transistors being connected to a respective control signal bus and connected via a resistor to one of the terminals of the d.c. voltage source.

BRIEF DESCRIPTION OF THE INVENTION

Other objects and advantages of the present invention will become more apparent from the following detailed description of preferred embodiments thereof to be read in conjunction with the accompanying drawings, wherein.

Figure 1:
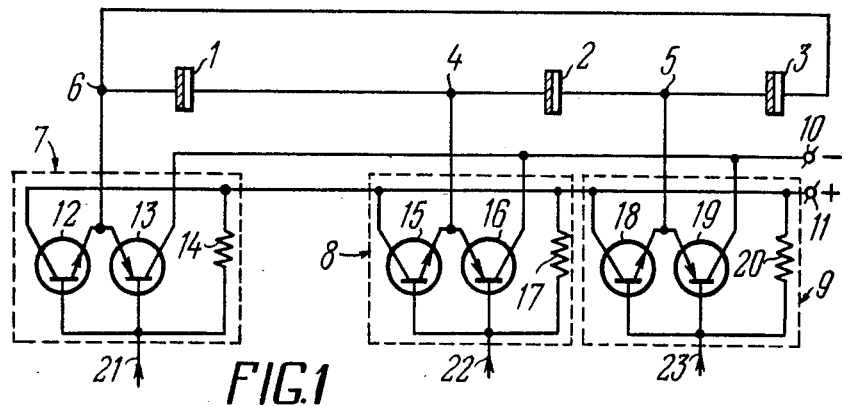
FIG. 1 is an electric diagram of an electrochromic indicator, wherein the resistors are connected to the positive terminal of the d.c. voltage source, in accordance with the invention.

Referring to the accompanying drawings, the proposed electrochromic indicator comprises three electrochromic cells 1 (FIG. 1), 2 and 3 connected in series to form a closed circuit. The proposed type of electrochromic indicator may incorporate any number of such electrochromic cells.

The anode lead of the electrochromic cell 1 is connected to the cathode lead of the next electrochromic cell 2; the anode lead of the electrochromic cell 2 is connected to the cathode lead of the electrochromic cell 3, etc. Each point 4, 5 and 6 of connection of said leads is coupled via a respective switching means (7, 8 and 9 to both terminals 10 and 11 of a d.c. voltage source.

Each of the switching means 7, 8 and 9 is an electronic switch built of two transistors of different conductivity. The switching means 7 comprises transistors 12 and 13 and a resistor 14. The switching means 8 comprises transistors 15 and 16 and a resistor 17. The switching means 9 comprises transistors 18 and 19 and a resistor 20.

The emitters of the transistors 12 and 13 are connected to the point 60 of connection of the leads of the electrochromic cells 1 and 3; the emitters of the transistors 15 and 16 are connected to the point 4 of connection of the leads of the electrochromic cells 1 and 2; and the emitters of the transistors 18 and 19 are connected to the point 5 of connection of the leads of the electrochromic cells 2 and 3.

The collectors of the transistors 12, 15 and 18 are connected to the positive terminal 11 of the d.c. voltage source; and the collectors of the transistors 13, 16 and 19 are connected to the negative terminal 10 of the d.c. voltage source.

A control signal bus 21 is connected to the bases of the transistors 12 and 13 and to a first lead of the resistor 14.

A control signal bus 22 is connected to the bases of the transistors 15 and 16 and to a first lead of the resistor 17.

A control signal bus 23 is connected to the bases of the transistors 18 and 19 and to a first lead of the resistor 20.

The second leads of the resistors 14, 17 and 20 are connected to the positive terminal 11 of the d.c. voltage source.

Figure 2:
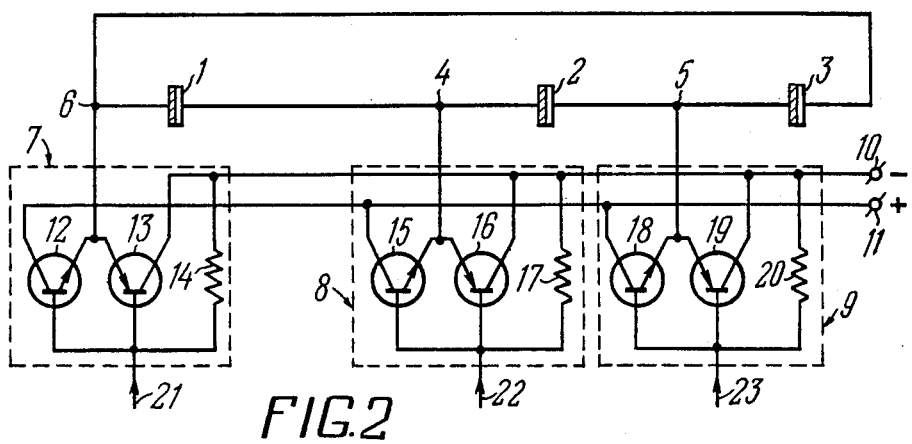
FIG. 2 is an electric diagram of the electrochromic indicator, wherein the resistors are connected to the negative terminal of the d.c. voltage source, in accordance with the invention.

The embodiment of FIG. 2 differs from that of FIG. 1 in that the second leads of the resistors 14, 17 and 20 are connected to the negative terminal 10 of the d.c. voltage source.

Figure 3:
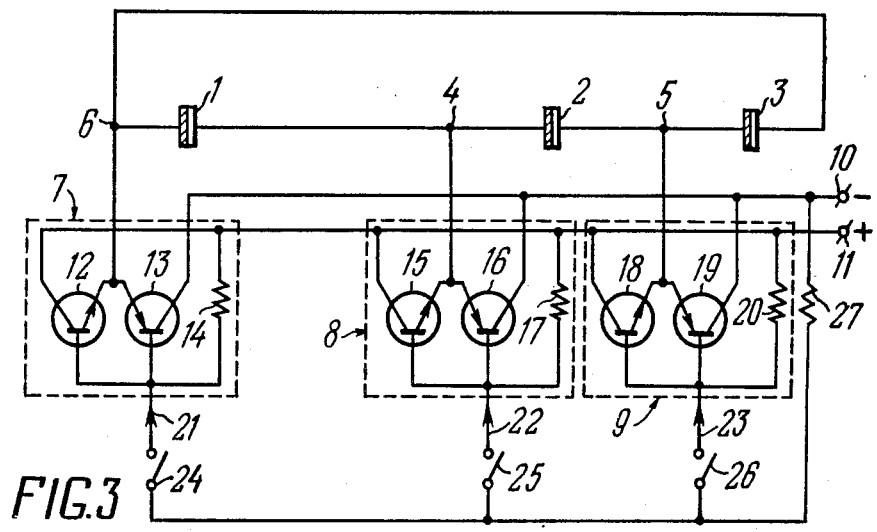
FIG. 3 is an electric diagram of an electrochromic indicator, wherein the control signal buses are connected to wave-band switches of a radio receiver, in accordance with the invention.

FIG. 3 shows an electrochromic indicator connected to wave-band switches 24, 25 and 26 of a radio receiver.

A first lead of each of the switches 24, 25 and 26 is connected to a respective central signal bus 21, 22 and 23; and the second lead of each of said switches 24, 25 and 26 is connected via a resistor 27 to the negative terminal 10 of the d.c. voltage source.

The proposed electrochromic indicator operates as follows.

It the initial state of the indicator, the electrochromic cells 1, 2 and 3 exhibit no coloration due to the absence of voltage between their leads.

As a negative control signal is applied to the bus 21 from the external control unit (not shown), the negative terminal 10 of the d.c. voltage source is connected to the point 6 via the emitter-collector junction of the transistor 13; at the same time, the positive terminal 11 of the d.c. voltage source is connected to the point 4 via the emitter-collector junction of the transistor 15.

As a result, the electrochromic cell 1 exhibits coloration and remains in this state after removal of the control signal from the bus 21.

The indicator assumes its original state.

As the next control signal is applied to the bus 22, the positive terminal 11 of the d.c. voltage source is connected to the point 6 via the emitter-collector junction of the transistor 12; at the same time, the negative terminal 10 of the d.c. voltage source is connected to the point 4 via the emitter-collector junction of the transistor 16, and the positive terminal 11 is connected to the point 5 via the emitter-collector junction of the transistor 18.

As a result, the electrochromic cell 2 is colored, while the cell 1 is bleached.

Following the removal of the control signal from the bus 22, the electrochromic cell 2 remains colored, whereas the indicator re-assumes its original state.

Thus, by successively applying control signals to the buses 21, 22, 23, etc., the electrochromic cells 1, 2 and 3 exhibit coloration one after the other, whereas the previously colored cell 3, 1 or 2 is bleached.

Depending on a specific application of the indicator, control signals may be simultaneously applied to at least two buses 22 separated by a third bus 22; in this case the number of the electrochromic cells 1, 2 and 3 and the switching means 7, 8 and 9 must be even.

As a result of simultaneous application of control signals to the buses 22 having even numbers, the electrochromic cells 2 having even numbers exhibit coloration; as a result of simultaneous application of control signals to the buses 23 having odd numbers, the electrochromic cells 3 having odd numbers exhibit coloration, whereas the previously colored cells 2 with even numbers are bleached.

Unlike the foregoing embodiment, the electrochromic cells 1, 2 and 3 in the indicator of FIG. 2 are colored when the indicator is in its initial state.

Operation of the indicator of FIG. 2 is similar to that of the indicator of FIG. 1. The only difference is that as a control signal is applied to the bus 22 (FIG. 2), the colored electrochromic cell 2 is bleached, and the previously bleached electrochromic cell 1 is colored.

If the electrochromic cells 1, 2 and 3 are arranged in a row in a display panel, it is possible to produce the impression of a bleached spot moving along a coloured panel; in the case of the indicator shown in FIG. 1, the impression is of a colored spot moving in a bleached panel.

If the electrochromic cells 1, 2 and 3 (FIG. 3) serve as as a band selector indicator of a radio receiver, a negative control signal is applied to each of the buses 21, 22 and 23 as a result of closure of the respective switch 24, 25 or 26, which, in turn, is brought about by turning the band selector.

The same type of circuitry may be used in clock dials to indicate minutes.

In this case, the electrochromic cells 1, 2 and 3 are arranged on the periphery of the dial and the switches 24, 25 and 26 are successively closed by the clock mechanism.

What is claimed is:

1. An electrochromic indicator comprising:
a plurality of electrochromic cells having anode and cathode leads and placed in series to form a closed circuit, said anode lead of each of said electrochromic cells being connected to said cathode lead of the next in order electrochromic cell;
a plurality of switching means, a point of connection of said anode and cathode leads of adjacent electrochromic cells being connected via a respective switching means to terminals of a d.c. voltage source, each of said switching means comprising a resistor, a control signal bus and two transistors of different conductivity, emitters of said transistors being connected to said point of connection of said leads of adjacent electrochromic cells, a first of said transistors having a collector connected to the positive terminal of said d.c. voltage source, a second of said transistors having a collector connected to the negative terminal of said d.c. voltage source, and said transistors having bases connected to a respective control signal bus and connected via said resistor to one of said terminals of said d.c. voltage source.

2. An electrochromic indicator according to claim 1, wherein said bases of said transistors of each of said switching means are connected via said resistor to said positive terminal of said d.c. voltage source.

3. An electrochromic indicator according to claim 2, further comprising a plurality of waveband switches, a first lead of each of said waveband switches being connected to a respective control signal bus; and a resistor connecting a second lead of each of said waveband switches to said negative terminal of said d.c. voltage source.

4. An electrochromic indicator according to claim 1, wherein said bases of said transistors of each of said switching means are connected via said resistor to said negative terminal of said d.c. voltage source.

* * * * *